(12) United States Patent
Hwang et al.

(10) Patent No.: US 10,438,922 B2
(45) Date of Patent: Oct. 8, 2019

(54) METHOD AND SYSTEM FOR MOUNTING COMPONENTS IN SEMICONDUCTOR FABRICATION PROCESS

(71) Applicant: Taiwan Semiconductor Manufacturing Co., Ltd., Hsinchu (TW)

(72) Inventors: Chien-Ling Hwang, Hsinchu (TW); Hsin-Hung Liao, Taipei (TW); Yu-Ting Chiu, Chu-Pei (TW); Ching-Hua Hsieh, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 124 days.

(21) Appl. No.: 15/173,816

(22) Filed: Jun. 6, 2016

(65) Prior Publication Data
US 2017/0352641 A1    Dec. 7, 2017

(51) Int. Cl.
*H05K 1/00* (2006.01)
*H05K 1/09* (2006.01)
*H01L 23/00* (2006.01)

(52) U.S. Cl.
CPC .............. *H01L 24/81* (2013.01); *H01L 24/09* (2013.01); *H01L 24/11* (2013.01); *H01L 24/13* (2013.01); *H01L 24/14* (2013.01); *H01L 24/742* (2013.01); *H01L 24/75* (2013.01); *H01L 24/83* (2013.01); *H01L 2224/11003* (2013.01); *H01L 2224/11005* (2013.01); *H01L 2224/11334* (2013.01); *H01L 2224/13017* (2013.01); *H01L 2224/751* (2013.01); *H01L 2224/75753* (2013.01); *H01L 2224/80127* (2013.01); *H01L 2224/80136* (2013.01); *H01L 2224/81024* (2013.01);
(Continued)

(58) Field of Classification Search
None
See application file for complete search history.

(56) References Cited

U.S. PATENT DOCUMENTS 6,213,386 B1 *   4/2001   Inoue ................... B23K 3/0623
                                                       228/245
7,780,063 B2 *   8/2010   Budd ................... B23K 1/0016
                                                       228/180.22
(Continued)

FOREIGN PATENT DOCUMENTS

EP     0826969 A2 *   3/1998   ......... G01R 31/2887
JP     10270144 A  *  10/1998

OTHER PUBLICATIONS

U.S. Appl. No. 14/630,934, filed Feb. 25, 2015.

*Primary Examiner* — Telly D Green
(74) *Attorney, Agent, or Firm* — McClure, Qualey & Rodack, LLP

(57) ABSTRACT

A method for mounting components on a substrate is provided. The method includes providing a positioning plate which has a plurality of through holes. The method further includes supplying components each having a longitudinal portion on the positioning plate. The method also includes performing a component alignment process to put the longitudinal portions of the components in the through holes. In addition, the method includes connecting a substrate to the components which have their longitudinal portions in the through holes and removing the positioning plate.

20 Claims, 14 Drawing Sheets

(52) U.S. Cl.
CPC .............. *H01L 2224/81201* (2013.01); *H01L 2224/81345* (2013.01)

(56) References Cited

U.S. PATENT DOCUMENTS

| | | | |
|---|---|---|---|
| 7,891,538 B2 * | 2/2011 | Budd | B23K 1/0016 |
| | | | 228/180.22 |
| 8,087,566 B2 * | 1/2012 | Budd | B23K 1/0016 |
| | | | 228/180.22 |
| 8,405,442 B2 | 3/2013 | Chen | |
| 8,436,671 B2 | 5/2013 | Chern et al. | |
| 8,441,806 B2 * | 5/2013 | Tsukada | H01L 23/142 |
| | | | 174/258 |
| 8,610,488 B2 | 12/2013 | Yu et al. | |
| 8,625,240 B2 | 1/2014 | Chung et al. | |
| 8,847,659 B1 | 9/2014 | Lan et al. | |
| 9,197,199 B2 | 11/2015 | Huang et al. | |
| 9,214,933 B2 | 12/2015 | Chern et al. | |
| 2007/0196588 A1 * | 8/2007 | Shinjo | B32B 37/04 |
| | | | 427/457 |
| 2009/0283575 A1 * | 11/2009 | Budd | B23K 1/0016 |
| | | | 228/246 |
| 2011/0080714 A1 * | 4/2011 | Tsukada | H01L 23/142 |
| | | | 361/774 |

* cited by examiner

METHOD AND SYSTEM FOR MOUNTING COMPONENTS IN SEMICONDUCTOR FABRICATION PROCESS

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductive layers of material over a semiconductor substrate, and patterning or processing the substrate and/or the various material layers using lithography to form circuit components and elements thereon and form integrated circuits. Dozens or hundreds of integrated circuits are typically manufactured on a single semiconductor wafer. The individual dies are singulated by sawing the integrated circuits along a scribe line. The individual dies are then packaged separately, in multi-chip modules, or in other types of packaging, for example.

Generally, a semiconductor die may be connected to other devices external to the semiconductor die through a type of packaging utilizing external connections. The external connections may be formed by initially forming a layer of underbump metallization in electrical connection with a contact pad on the semiconductor die and then placing additional conductive material onto the underbump metallization. In between the underbump metallization and the contact pad may be a passivation layer that is used to protect and support the structures of the semiconductor die. Once in place, the additional conductive material may be placed in physical contact with the external device and then the semiconductor device may be bonded to the external device. In such a fashion, a physical and electrical connection may be made between the semiconductor die and an external device, such as a printed circuit board, another semiconductor die, or the like.

Although existing devices and methods for forming external connections have been generally adequate for their intended purposes, they have not been entirely satisfactory in all respects. Consequently, it would be desirable to provide a solution for forming the external connections for use in a wafer process apparatus.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
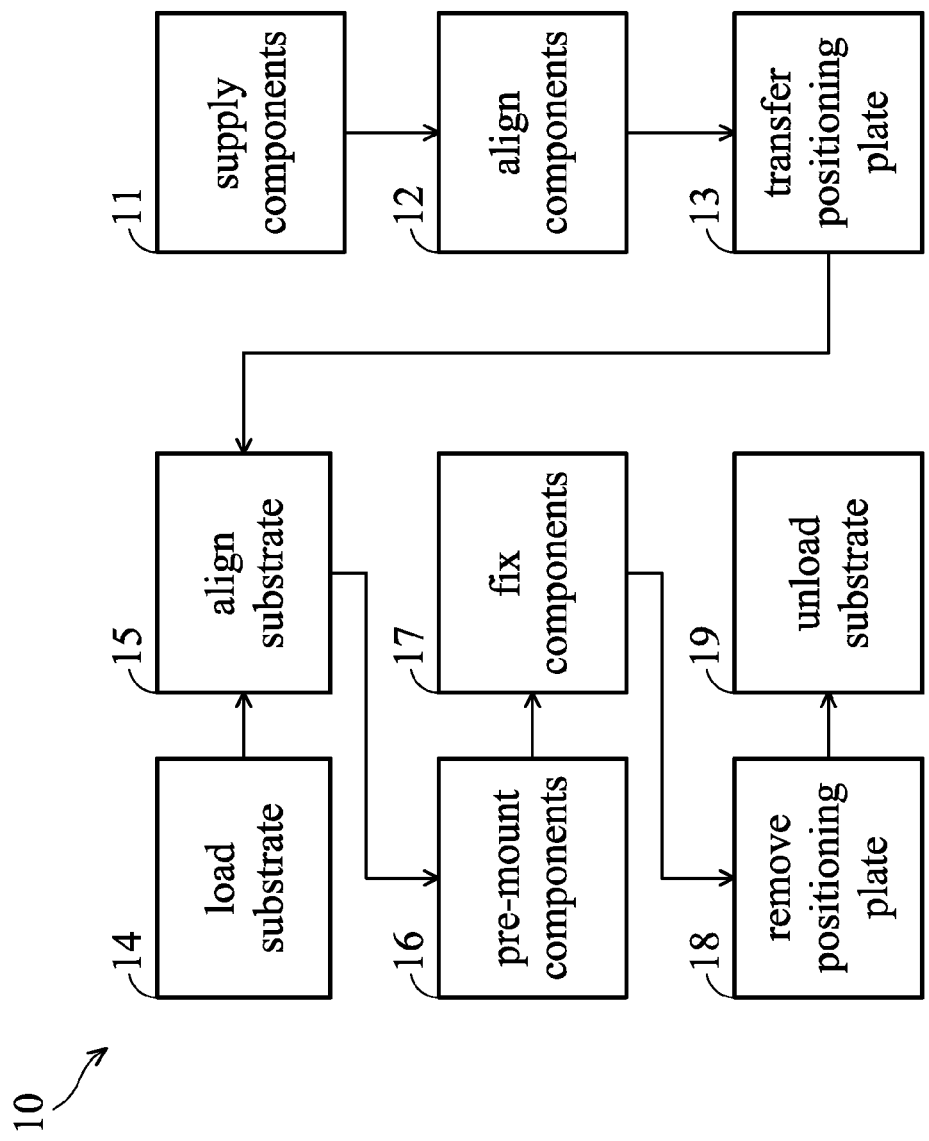
FIG. 1 shows a flow chart illustrating a method for mounting components on a substrate, in accordance with some embodiments.

The following disclosure provides many different embodiments, or examples, for implementing different features of the subject matter provided. Specific examples of solutions and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It is understood that additional operations can be provided before, during, and after the method, and some of the operations described can be replaced or eliminated for other embodiments of the method.

FIG. 1 is a flow chart illustrating a method 10 for positioning components on a substrate, in accordance with some embodiments. For illustration, the flow chart will be described along with the drawings shown in FIGS. 2-3 which show schematic views of an apparatus 20 and the drawing shown in FIGS. 4-12 which show schematic views of stages of the method 10. Some of the described stages can be replaced or eliminated in different embodiments. Additional features can be added to the semiconductor device structure. Some of the features described below can be replaced or eliminated in different embodiments.

Figure 4:
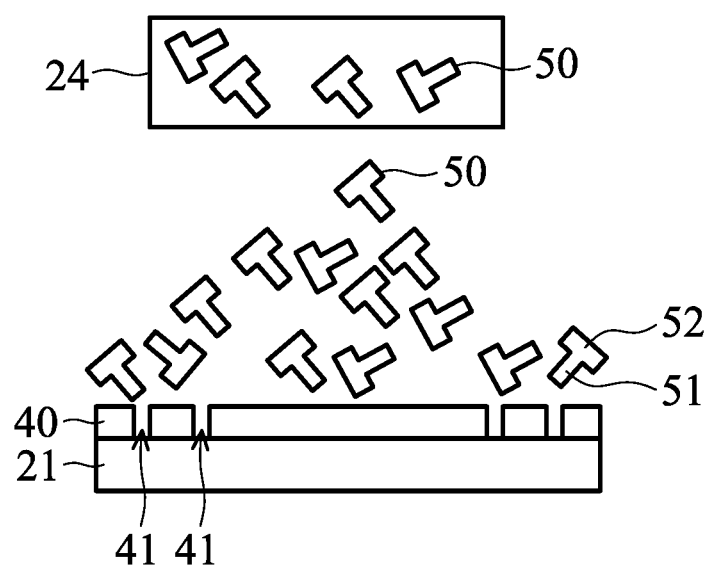
FIG. 4 shows a schematic view of one stage of a method for mounting components on a substrate, in accordance with some embodiments.

The method 10 begins with operation 11, as shown in FIG. 4, in which components 50 are supplied over a positioning plate 40 from a component source 23. In some embodiments, the number of components 50 supplied to the positioning plate 40 is significantly greater than the number of through holes 41 formed on the positioning plate 40. The number of components 50 supplied to the positioning plate 40 may be determined by the time period for supplying the components 50 from the component source 23. In some embodiments, the number of components 50 supplied to the positioning plate 40 is greater than 1000.

Figure 2:
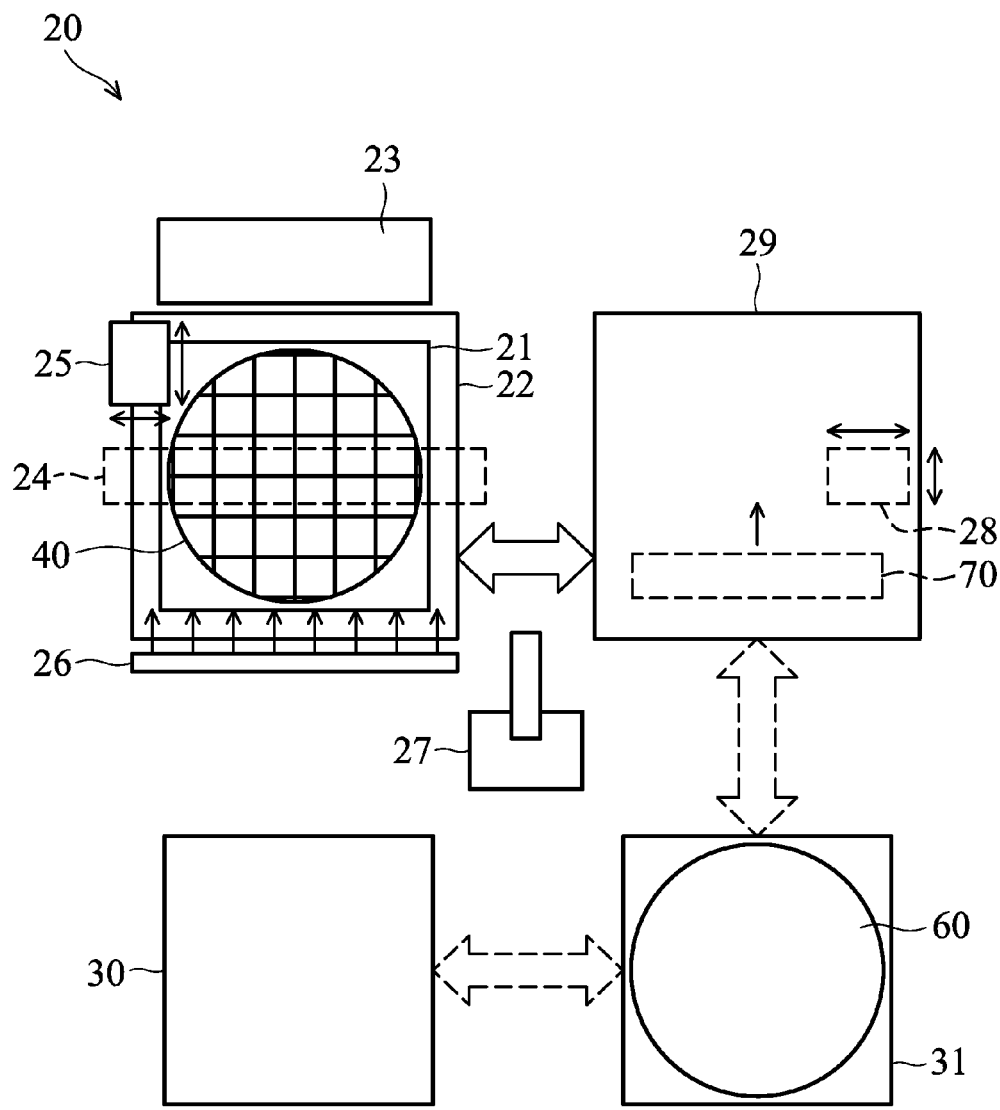
FIG. 2 shows a schematic view of an apparatus for mounting components, in accordance with some embodiments.

As shown in FIG. 2, in some embodiments, the apparatus 20 includes a bottom support 21, a manipulation drive 22, and the component source 23. In some embodiments, the bottom support 21 is configured to affix the positioning plate 40 and disposed on the manipulation drive 22. The manipulation drive 22 is configured to move the bottom support 21 in different modes, such as vibration mode and swaying mode.

In some embodiments, the manipulation drive 22 is further designed and configured to be operable for translational and rotational motion. In some embodiments, the manipulation drive 22 is further designed operably to tilt or dynamically change the tilt angle. The manipulation drive 22 may be connected to a controller (not shown in figures), and the manipulation drive 22 moves the bottom support 21 according to the signals issued by the controller. The manipulation drive 22 may include a number of actuators, such as a vibration motor and tilt motor.

The component source 23 is positioned adjacent to a bottom support 21. The component source 23 contains a number of components 50 (not shown in FIG. 2). The component source 23 may be connected to a controller (not shown in figures), and the component source 23 supply the components 50 over the positioning plate 40 through an outlet according to the signal issued from the controller. The component source 23 may move across the bottom support 21 during the supply of the components 50. The components source 23 may also include an inlet for recycling the excess components that have been supplied on the positioning plate 40. The details of the recycling process of the components 50 will be described later.

Figure 3:
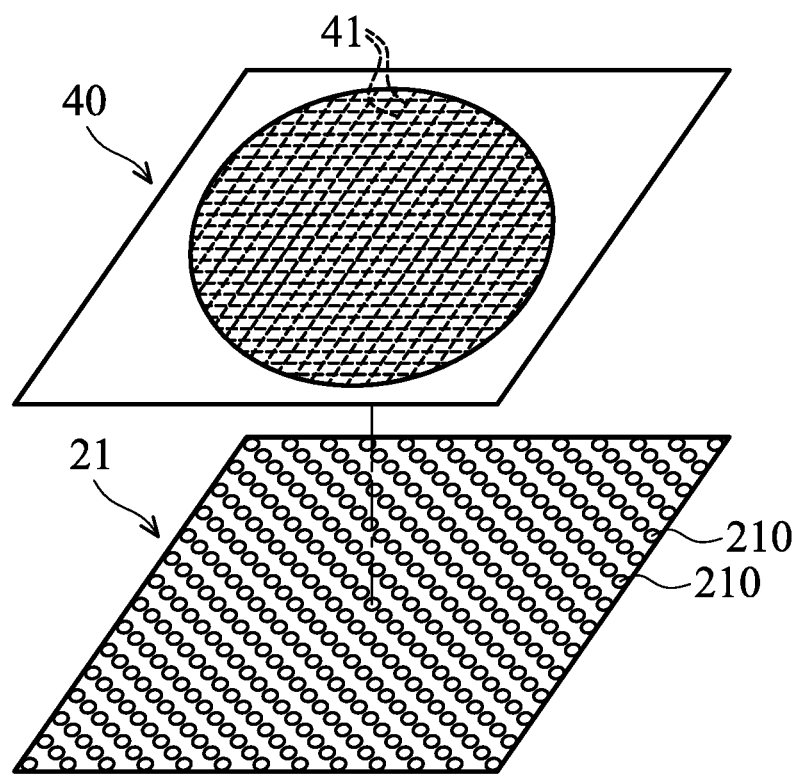
FIG. 3 shows an exploded view of partial elements of an apparatus for mounting components, in accordance with some embodiments.

In some embodiments, as shown in FIG. 3, the bottom support 21 has a number of pores 210. The pores 210 are evenly distributed over the entire surface of the bottom support, and the pores 210 connect to a vacuum source. As a result, when the positioning plate 40 is placed over the bottom support 21, the positioning plate 40 is held in place by a vacuum, and the planarity of the positioning plate 40 is improved. In addition, a number of through holes 41 are formed on the positioning plate 40. The through holes 41 are formed according to the desired pattern. For example, the through holes 41 are formed according to the pattern of the contact pads (not shown in FIG. 3) that are formed on the substrate to which the components are connected.

In some embodiments, each of the components 50 has a T-shaped cross section and includes a longitudinal portion 51 and a top portion 52. The longitudinal portion 51 has a cylindrical shape and extends in the direction of the length of the component 50. The top portion 52 connects to one end of the longitudinal portion 51. A round corner surrounds the boundary of the longitudinal portion 51 and the top portion 52.

The radius of the round corner may be in a range from about 0.001 mm to about 0.45 mm. This feature will be better understood with reference to FIG. 6. The width of the longitudinal portion 51 is smaller than the width of the through hole formed on the positioning plate 40, and the width of the top portion is greater than the width of the through hole 41 formed on the positioning plate 40. In addition, the length of the longitudinal portion 51 is smaller than the depth of the through hole 41 formed on the positioning plate 40.

Figure 5:
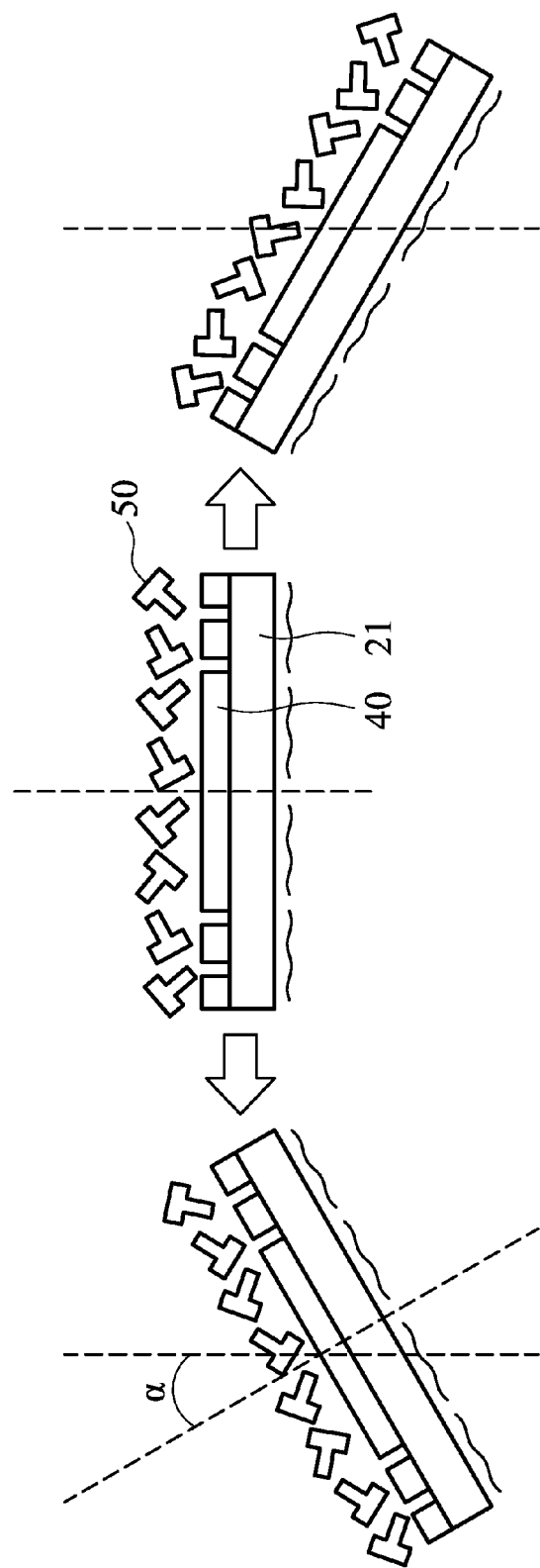
FIG. 5 shows a schematic view of one stage of a method for mounting components on a substrate, in accordance with some embodiments.

The method 10 continues with operation 12 in which, as shown in FIG. 5, a component alignment process is performed. In some embodiments, the component alignment process includes moving the positioning plate 40 in a swaying mode. In the swaying mode, the positioning plate 40 and the bottom support 21 are swung by the manipulation drive 22 multiple times to change the inclined angle of the positioning plate 40 relative to a vertical axis V. The tilt angle α may range from about 3 degrees to about 15 degrees. The positioning plate 40 may be swung along one curved path. Alternatively, the positioning plate 40 may be swung along multiple curved paths.

In some embodiments, the component alignment process includes moving the positioning plate 40 in a vibration mode. In the vibration mode, the positioning plate 40 and the bottom support 21 are vibrated by the manipulation drive 22 at a frequency that may range from about 30 Hz to about 100 Hz.

In some embodiments, the positioning plate 40 and the bottom support 21 are moved in the vibration mode and the swaying mode simultaneously. In some embodiments, the positioning plate 40 and the bottom support 21 are moved in the vibration mode before or during the supply of the components 50 in operation 11. In some embodiments, the positioning plate 40 and the bottom support 21 are moved in the swaying mode once the operation 11 is finished.

FIG. 6A to 6D illustrate the process in which one of the component 50 enters the through hole 41 of the positioning plate 40, in accordance with some embodiments of the disclosure. When the positioning plate 40 is moved in a swaying mode, the components 50 supplied on the positioning plate 40 are moved on the upper surface 43 of the positioning plate 40, and some of them enter the through holes 41 of the positioning plate 40 via their longitudinal portions 51.

Figure 6A:
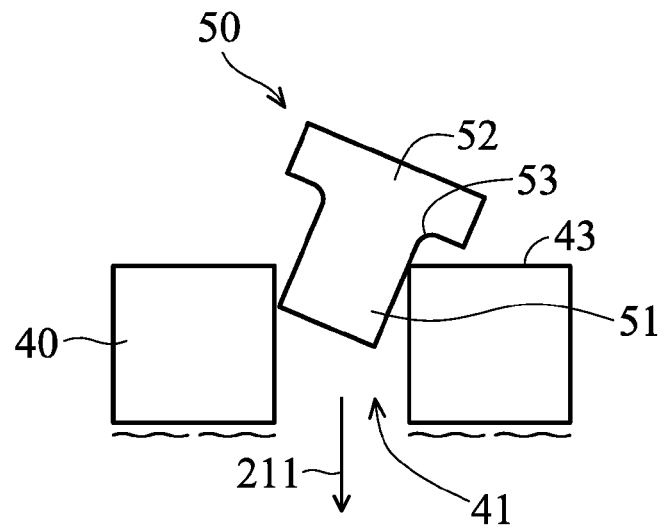
FIGS. 6A-6D show schematic views of one stage of a method for mounting components on a substrate, in accordance with some embodiments.

In some embodiments, as shown in FIG. 6A, the longitudinal portion 51 may enter the through hole 41 in an askew manner and get stuck at the upper end of the through hole 41. However, due to the vibration applied on the positioning plate 40, the longitudinal portion 51 is able to be smoothly guided to enter the through hole 41 by gravity, as shown in FIG. 6B.

Figure 6B:
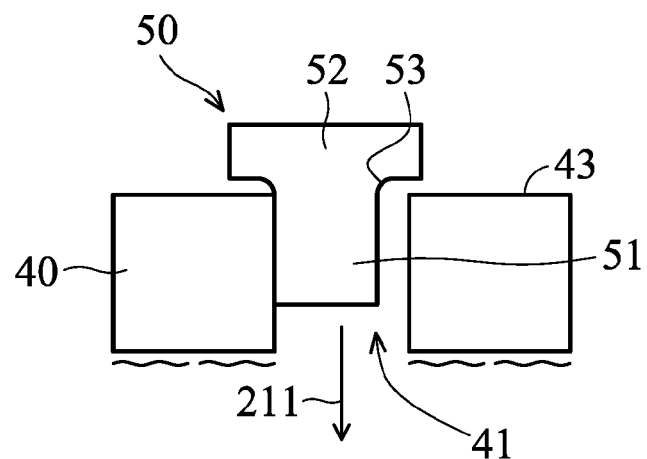
Figure 6C:
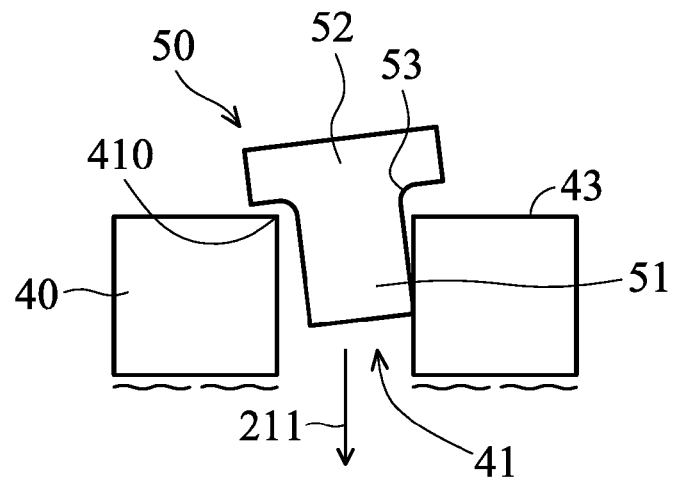
Figure 6D:
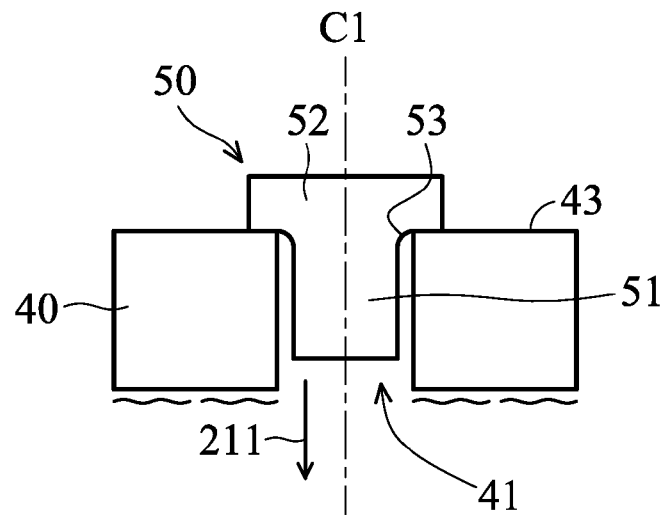

In some embodiments, when the longitudinal portion 51 enters the through hole 41, the center of the longitudinal portion 51 may not align with the center of the through hole 41, as shown in FIG. 6B. This problem may cause the product yield to decrease, because the components 50 cannot be connected to the correct position on the substrate. However, as shown in FIG. 6C, as the round corner 53 of the component 53 is abutted against the edge 410 of the through hole 41, the center of the longitudinal portion 51 may gradually align with the center C1 of the through hole 41, as shown in FIG. 6D.

In some embodiments, during the insertion of the components 50 into the through hole 41, the components 52 are sucked by the vacuum flow 211 produced by the bottom support 21. The vacuum flow 211 improves the efficiency of the component alignment process.

Figure 7:
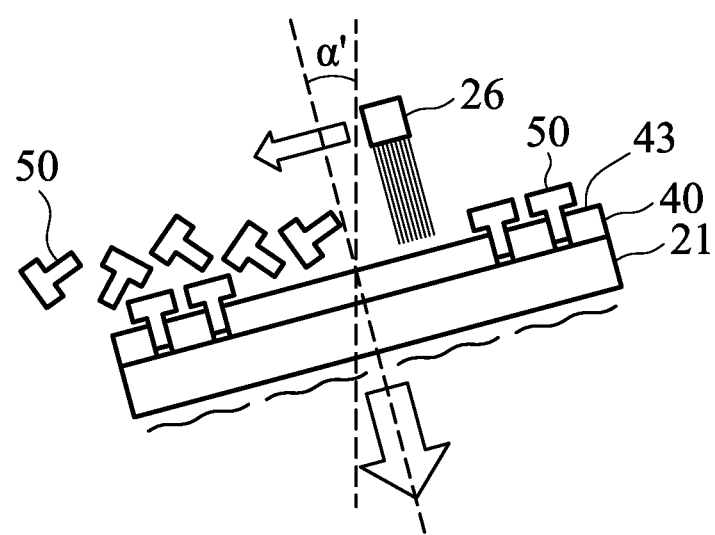
FIG. 7 shows a schematic view of one stage of a method for mounting components on a substrate, in accordance with some embodiments.

In some embodiments, once the component alignment process is finished, the excess components 50 that do not enter the through holes 41 are removed. As shown in FIG. 7, to remove the excess components 50, the positioning plate 40 may be tilted at a predetermined angle α' at which most of the excess components 50 are expelled from the upper surface 43 of the positioning plate 40, but the components 50 already in the through holes 41 are kept in the through holes 41. The predetermined angle α' is greater than the angle α at which the positioning plate 40 is moved in the swaying mode.

Moreover, to remove the excess components 50, a brush 26 may be used to move across the positioning plate 40 so as to remove the components 50 from the upper surface 43. The brush 26 may have electrostatic discharge (ESD) protection so as to prevent the components 50 already in the through holes 41 from being attracted by electrostatic force. The brush 26 may have a greater width than that of the positioning plate 40. In some embodiments, the brush 26 has a width in a range from about 300 mm to about 400 mm.

Referring to FIG. 2, in some embodiments, the apparatus 20 further includes an automatic optical inspector 25. The automatic optical inspector 25 is positioned above the bottom support 21 and is configured to inspect the arrangement of the components 50 after the component alignment process. The automatic optical inspector 25 may scan across the positioning plate 40 and produce a number of images of different regions of the positioning plate 40. A computer (not shown in figure) analyzes the images to determine if any through hole 41 of the positioning plate 40 is not filled with the component 50.

In some embodiments, the apparatus 20 further includes an ionizing blower 24. The ionizing blower 24 is positioned above the bottom support 21 and configured to produce ion flow over the bottom support 21. The ionizing blower 24 may include an ion source and a blower (not shown in figures) to create an air flow to transfer the ion particles produced by the ion source.

The method 10 continues with operation 13, in which the positioning plate 40 is transferred to another position for mounting the components 50 to the substrate 60. In some embodiments, once the component alignment process is finished, the production of the vacuum is stopped, and the positioning plate 40 is moved from the bottom support 21 to a transferring mechanism 27. Afterwards, the positioning plate 40 with the components 50 staying in the through holes 41 is transferred to a position underneath a substrate stage 29 by the transferring mechanism 27. In the meantime, the upper surface 43 of the positioning plate 40 faces the substrate stage 29. The transferring mechanism 27 may include a rail and platform (not show in figures). The positioning plate 40 is placed on the platform and moved along the rail.

The method continues with operation 14, in which a substrate 60 is loaded to a substrate stage 29. In some embodiments, before being held by the substrate stage 29, the substrate 60 is transferred from a load port 30 to a flipping mechanism 31. In the flipping mechanism 31 the orientation of the substrate 60 is upside down.

Afterward, the substrate 60 with its processing surface oriented downwardly is transferred to the substrate stage 29. The substrate stage 29 is oriented downwardly and configured for holding, positioning, moving, and otherwise manipulating the substrate 60. In some embodiments, the substrate 60 is secured on a substrate stage 29 by a clamping mechanism, such as vacuum clamping or e-chuck clamping. The bottom surface of the substrate 60 is connected to the substrate stage 29.

In some embodiments, the operation 13 and the operation 14 are performed at the same time. The substrate 60 and the positioning plate 40 are moved by two different transfer mechanisms. In some embodiments, the operation 13 is performed after the operation 14 is finished.

In some embodiments, the substrate 60 may include other elementary semiconductor materials such as germanium (Ge). In some embodiments, the substrate 60 is made of a compound semiconductor such as silicon carbide (SiC), gallium arsenic (GaAs), indium arsenide (InAs), or indium phosphide (InP). In some embodiments, the substrate 60 is made of an alloy semiconductor such as silicon germanium (SiGe), silicon germanium carbide (SiGeC), gallium arsenic phosphide (GaAsP), or gallium indium phosphide (GaInP). In some embodiments, the substrate 60 includes an epitaxial layer. For example, the substrate 60 has an epitaxial layer overlying a bulk semiconductor. In some other embodiments, the substrate 60 may be a silicon-on-insulator (SOI) or a germanium-on-insulator (GOI) substrate.

The substrate 60 may have various device elements. Examples of device elements that are formed in the substrate 60 include transistors (e.g., metal oxide semiconductor field effect transistors (MOSFET), complementary metal oxide semiconductor (CMOS) transistors, bipolar junction transistors (BJT), high voltage transistors, high-frequency transistors, p-channel and/or n-channel field-effect transistors (PFETs/NFETs), etc.), diodes, and/or other applicable elements. Various processes are performed to form the device elements, such as deposition, etching, implantation, photolithography, annealing, and/or other suitable processes.

Figure 8:
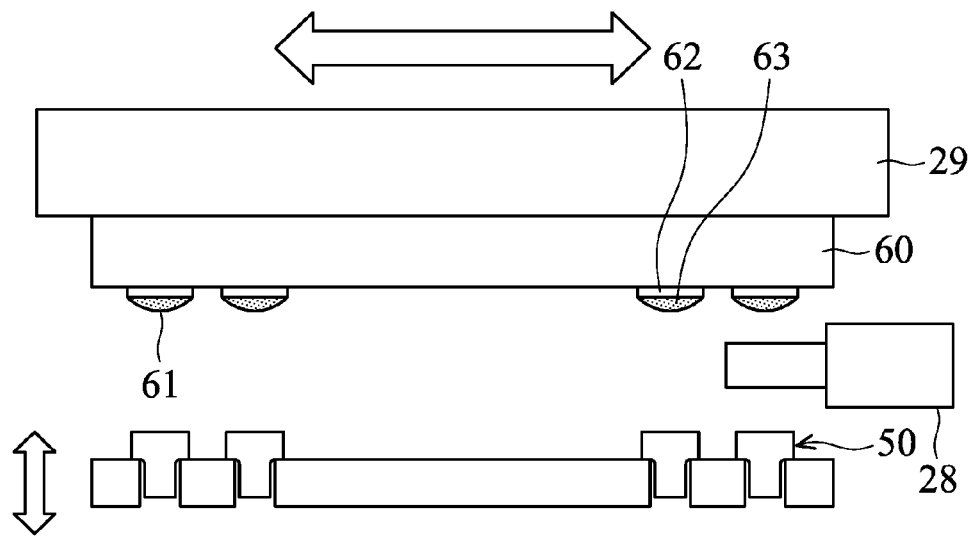
FIG. 8 shows a schematic view of one stage of a method for mounting components on a substrate, in accordance with some embodiments.

In some embodiments, as shown in FIG. 8, a number of contact pads 62 are formed on the substrate 60 for facilitating electrical connection of the device formed on the substrate 60. In some embodiments, a solder paste material 63 (or flux) is applied on the contact pads 62.

The method 10 continues with operation 15, and a substrate alignment process is performed. In some embodiments, the positioning plate 40 and the substrate 60 are aligned via a CCD (charge-coupled device) module 28. Specifically, as shown in FIG. 8, the CCD module 28 is arranged between the positioning plate 40 and the substrate 60 and produces real-time images of one of the conductive pads 62 and one of the components 50. The CCD module 28 may capture a number of images in relation to different regions on the positioning plate 40 and the substrate 60. The CCD module 28 may be moved in two horizontal directions so as to captures these images.

Afterwards, the images are transmitted to a computer, and the computer analyzes if the conductive pad 62 is aligned with the component 50. If the conductive pad 62 is not aligned with the component 50, an actuator (not shown in the figures) is used to adjust the position of the substrate stage 29 until the conductive pad 62 is aligned with the component 50. However, it should be appreciated that many variations and modifications can be made to embodiments of the disclosure.

In some embodiments, during the substrate alignment process, the position of the positioning plate 40 is adjusted according to the real-time images. In some embodiments, during the substrate alignment process, both the positioning plate 40 and the substrate 60 are moved according to the real-time images.

Figure 9:
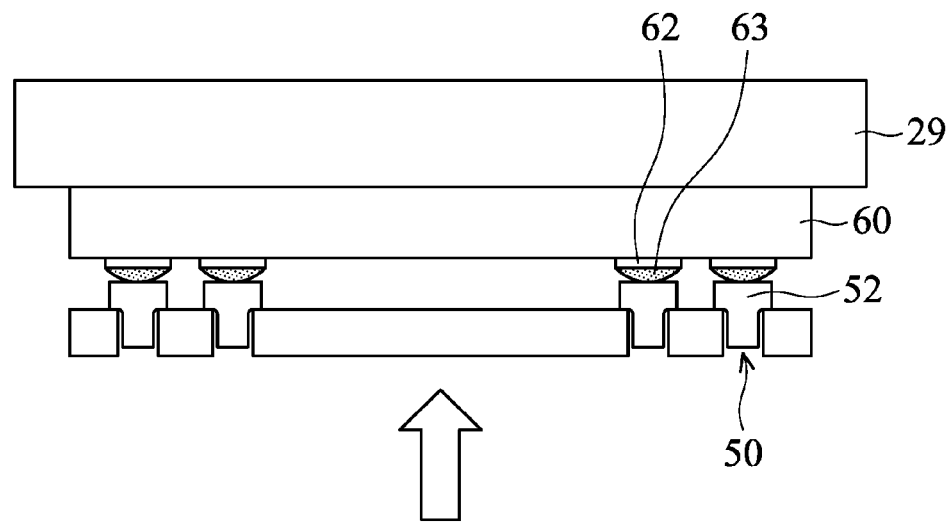
FIG. 9 shows a schematic view of one stage of a method for mounting components on a substrate, in accordance with some embodiments.

The method 10 continues with operation 16, in which, as shown in FIG. 9 the components 50 are pre-mounted on the substrate 60. In some embodiments, the positioning plate 40 is lifted up to put the top portions 53 of the components 50 in contact with the contact pads 62. In the meantime, a gentle force is applied to the positioning plate 40, so that the solder paste 63 is pressed by the top portion 53 and the contact pads 62, and the component is attached on the solder paste 63.

Figure 10:
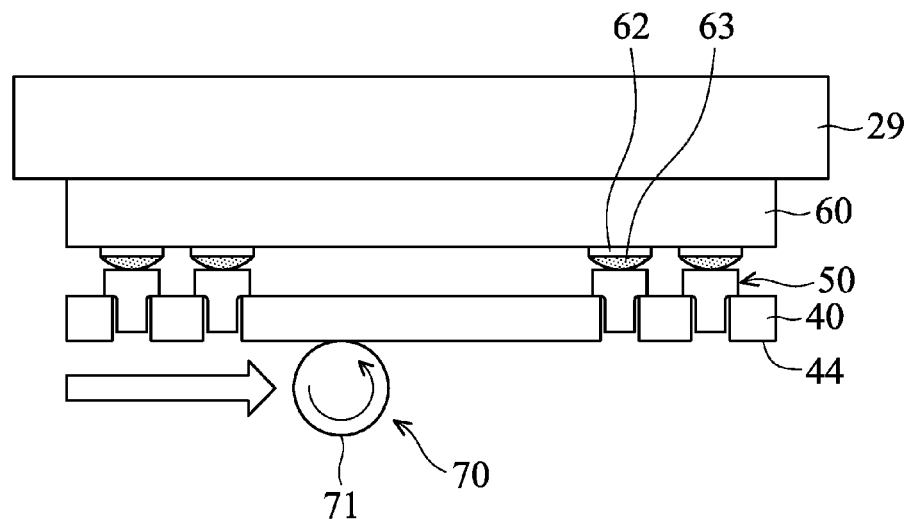
FIG. 10 shows a schematic view of one stage of a method for mounting components on a substrate, in accordance with some embodiments.

The method 10 continues with operation 17 in which a force is applied to the positioning plate 40 to stably connect the components 50 to the substrate 60, as shown in FIG. 10. In some embodiments, after the operation 16 is finished, the platform for supporting the positioning plate 40a is separated from the positioning plate 40, and a force is forcibly applied on the lower surface 44 of the positioning plate 40 by an enforcing element 70.

In some embodiments, the enforcing element 70 includes a cylindrical roller 71. The cylindrical roller 71 rolls over the entire lower surface 44 so as to ensure that all of the components 50 are affixed to the corresponding contact pads 62. The cylindrical roller 71 may be made of natural or artificial rubber, rubber surrogate, or any other flexible material.

Figure 11:
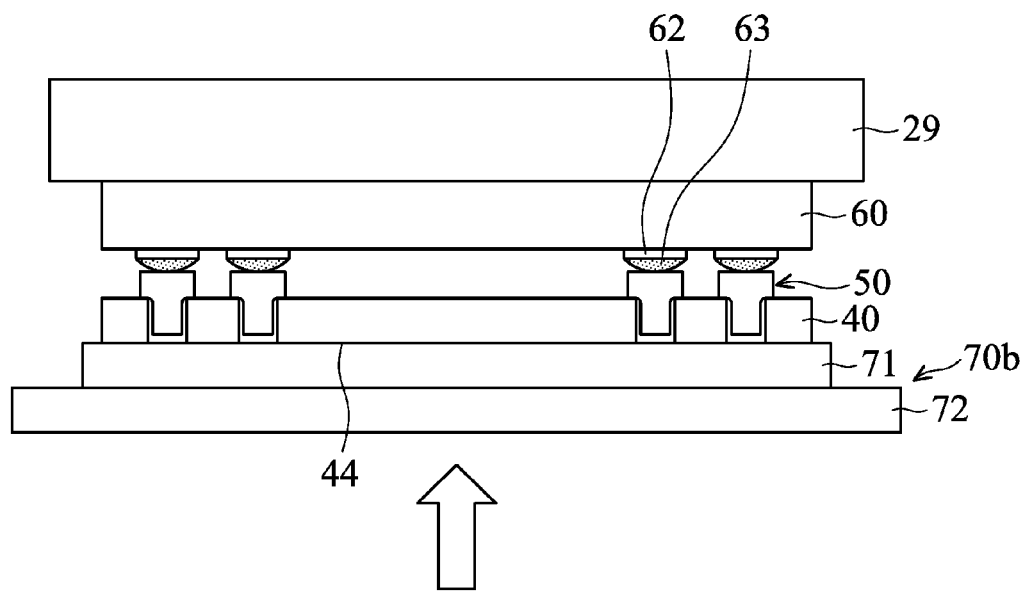
FIG. 11 shows a schematic view of one stage of a method for mounting components on a substrate, in accordance with some embodiments.

Alternatively, as shown in FIG. 11, a force is applied on the lower surface 44 of the positioning plate 40 by an enforcing element 70a. The enforcing element 70a includes a flexible material 71a and a support 72a. The flexible material 71a is disposed on the support 72a. The support 72a applies an evenly force, and the lower surface 44 of the positioning plate 40 is pressed by the flexible material 71a. As a result, the components 50 are stably mounted on the contact pads 62. The flexible material 71a may be made of natural or artificial rubber, rubber surrogate, or any other flexible material.

Figure 12:
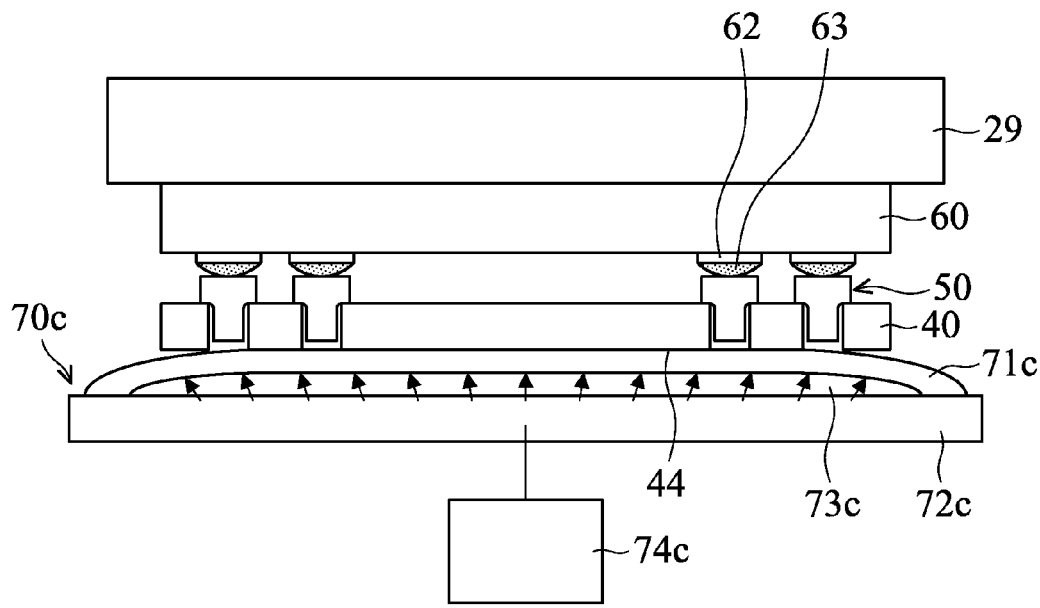
FIG. 12 shows a schematic view of one stage of a method for mounting components on a substrate, in accordance with some embodiments.

Alternatively, as shown in FIG. 12, a force is applied on the lower surface 44 of the positioning plate 40 by an enforcing element 70b. The enforcing element 70b includes a flexible film 71c, a support 72c, and a pneumatic actuator 74c. A chamber 73c is defined by the flexible film 71c and the support 72c. The pneumatic actuator 74c is connected to the chamber 73c via a gas line to supply gas into the chamber 73c. To apply force on the lower surface 44 of the positioning plate 40, the flexible film 71c is in contact with the lower surface 44, and gas is supplied into the chamber 73c from the pneumatic actuator 74c, so as to enforce the components 50 to be fixed on the contact pads 62. The cover 74 may be made of natural or artificial rubber, rubber surrogate, or other flexible material.

In some embodiments, when the force is applied on the lower surface 44 of the positioning plate 40, the bottom surface of the top portion 52 is compressed by the upper surface 43 of the positioning plate 40 due to the top portion having a greater width than the longitudinal portion 51. As a result, the pressure is evenly distributed on the top portion 52.

Figure 13:
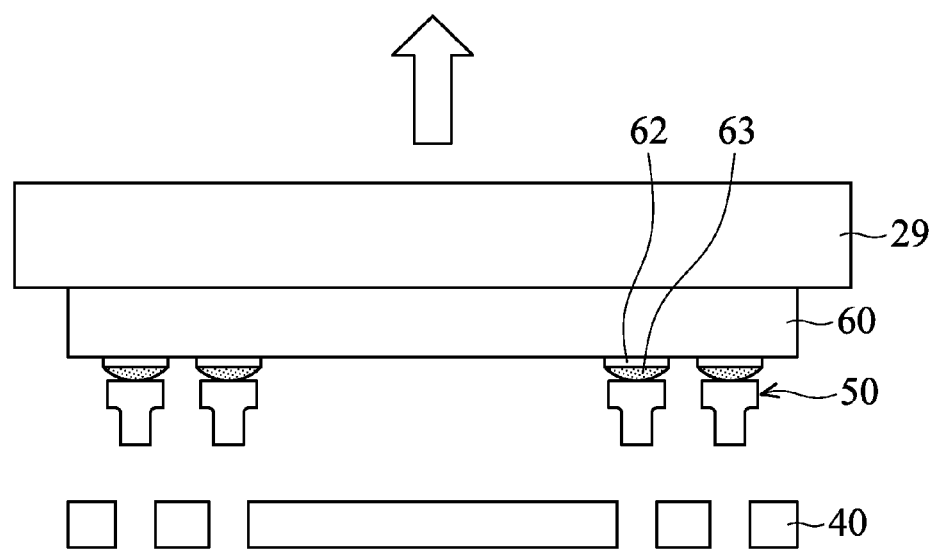
FIG. 13 shows a schematic view of one stage of a method for mounting components on a substrate, in accordance with some embodiments.

The method 10 continues with operation 18, in which the positioning plate 40 is removed, as shown in FIG. 13. In some embodiments, the positioning plate 40 is held by the transferring mechanism 27 during the operations 13, 16, and 18. As the substrate stage 29 is being pulled up, the components 50 are detached from the positioning plate 40. Afterwards, the positioning plate 40 may be transferred to the bottom support 21.

The method 10 continues with operation 18 the substrate 60 is unloaded. In some embodiments, the substrate 60 with components 50 are transferred to the flipping mechanism 31 and turned over again to make the processing surface of the substrate 60 oriented upward. Afterwards, the substrate 60 is transferred to a wafer cassette (not shown in figures) via the load port 30.

Figure 14:
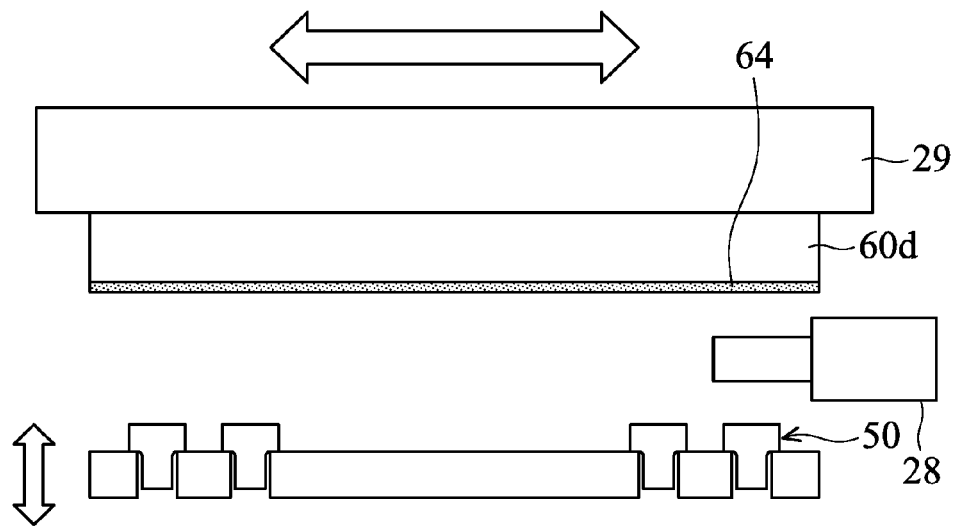
FIG. 14 shows a schematic view of one stage of another method for mounting components, in accordance with some embodiments.
Figure 15:
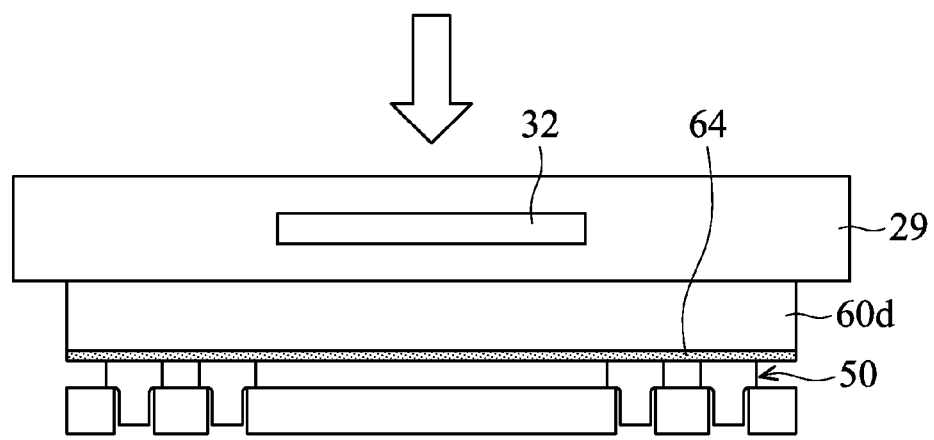
FIG. 15 shows a schematic view of one stage of another method for mounting components on a substrate, in accordance with some embodiments.

FIGS. 14 and 15 show schematic views of stages of a method to connect the components 50 to a substrate 60d. In some embodiments, the substrate 60d has no contact pads to be connected to the components 50. The components 50 are connected to the outermost surface of the substrate 60d. In some embodiments, an adhesive film 64 is applied over the outermost surface of the substrate 60d.

In some embodiments, the method for connecting the components 50 to the substrate 60d is similar to the method 10 shown in FIG. 1. Therefore, some of the operations will not be repeated herein for brevity. Differences between these two methods include the operation 14 of substrate alignment and operation 16 of pre-mounting the components.

Specifically, as shown in FIG. 15, in the operation 14, the CCD module 28 is arranged between the positioning plate 40 and the substrate 60 and produces real-time images of one of the edge of substrate 60 and the edge of the positioning plate 40. An adjustment of the position of the substrate 60 or the positioning plate 40 is performed until the edge of the substrate 60 is aligned with the edge of the positioning plate 40. In some embodiments, the operation 14 is omitted.

In addition, in operation 16, the substrate 60 is heated by a heater 32 that may be mounted in the substrate stage 29, so as to melt the adhesive film 64 applied on the substrate 60, and the components 50 are pre-mounted on the substrate 60 via the adhesive film 64.

Figure 16:
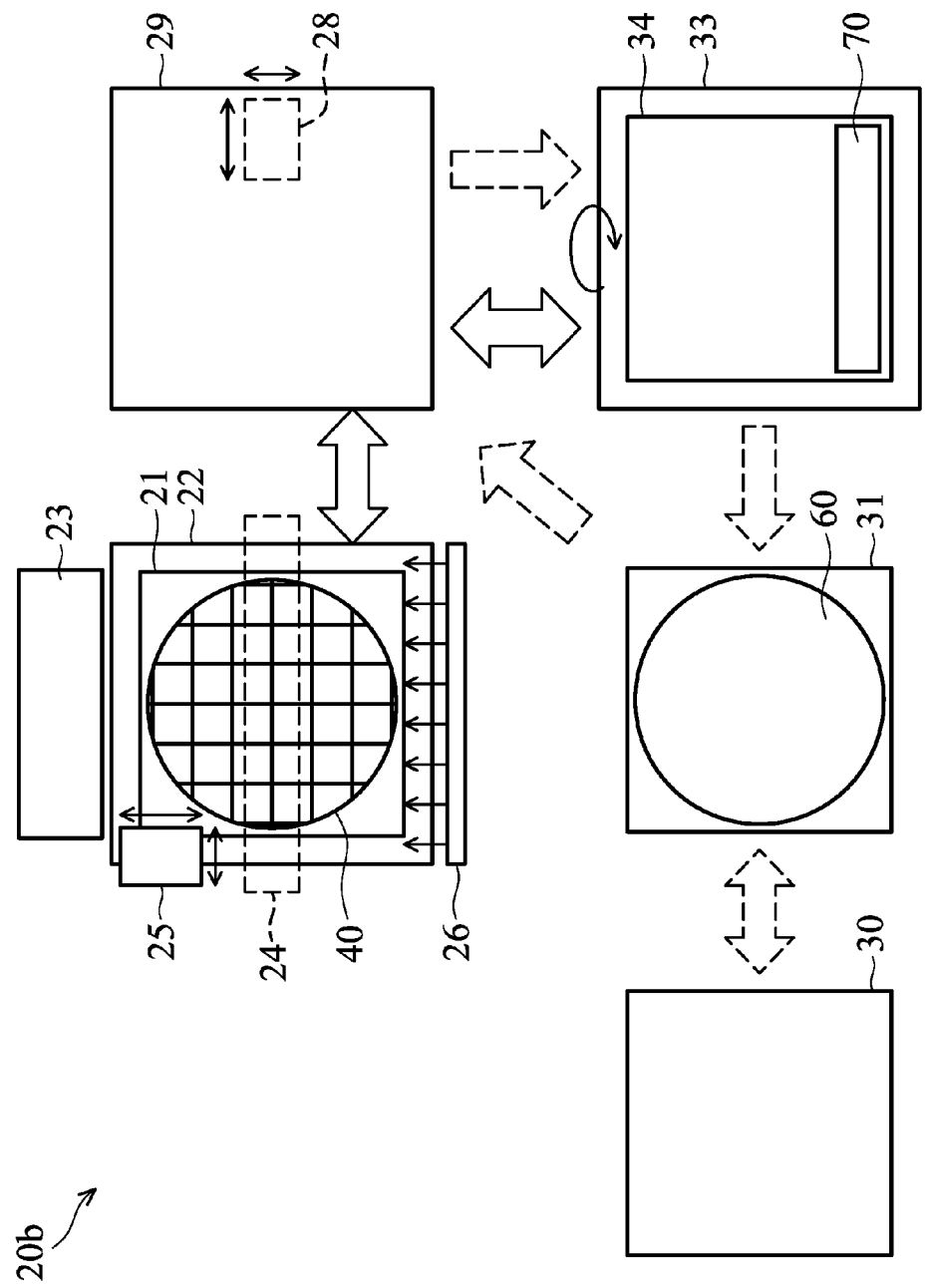
FIG. 16 shows a schematic view of an apparatus for mounting components on a substrate, in accordance with some embodiments.

FIG. 16 shows a schematic view of an apparatus 20b for mounting components, in accordance with some embodiments of the disclosure. In the embodiments of FIG. 16, elements that are similar to those of the embodiments of FIG. 2 are provided with the same reference numbers, and the features thereof are not repeated in the interest of brevity. Differences between the apparatus 20b and the apparatus 20 include the apparatus 20b further including another substrate stage 33 and another flipping mechanism 34 and the enforcing element 70 is positioned above the substrate stage 33.

Figure 17:
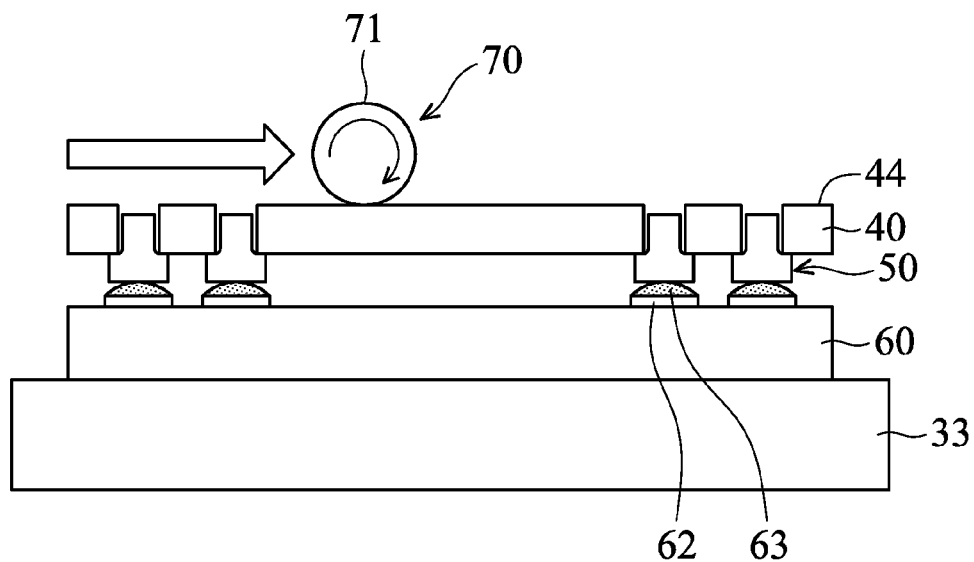
FIG. 17 shows a schematic view of one stage of yet another method for mounting components, in accordance with some embodiments.
Figure 18:
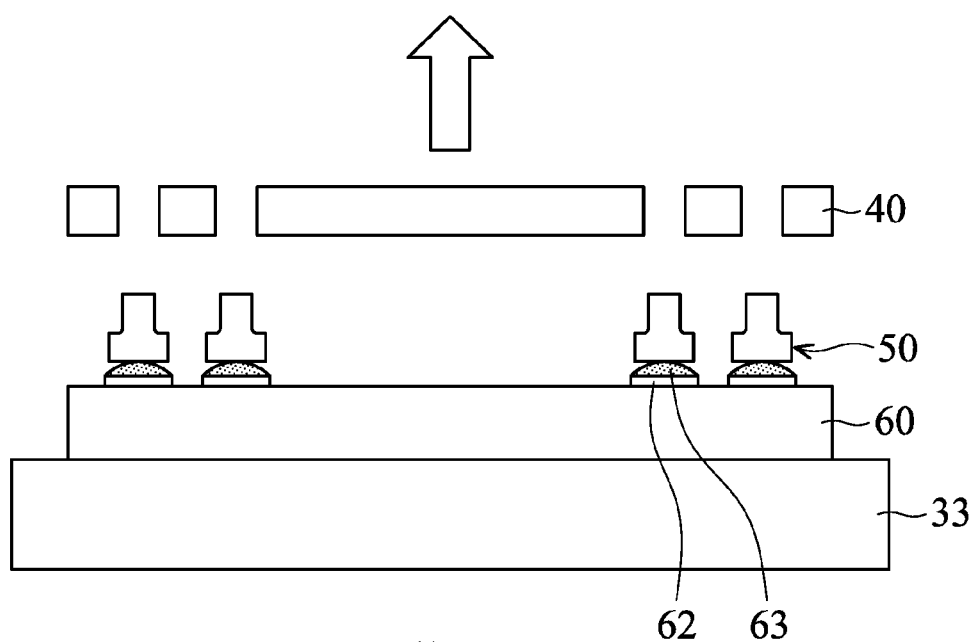
FIG. 18 shows a schematic view of one stage of yet another method for mounting components, in accordance with some embodiments.

In some embodiments, the method for connecting the components 50 to the substrate 60 by the use of the apparatus 20b is similar to the method 10 shown in FIG. 1. However, after the operation 16 for pre-mounting the components 50 on the positioning plate 40, the positioning plate 40 and the substrate 60 are turned over by the flipping mechanism 34, and the operation 17 for fixing the components 50 by the use of the enforcing element 70 are performed on the substrate stage 33, as shown in FIG. 17. Since the components 50 are mounted on the surface of the substrate 60 oriented upward, as shown in FIG. 18, when positioning plate 40 is removed, the components 50 are stably mounted on the substrate.

Embodiments of connecting components to a substrate in semiconductor fabrication are provided. By performing the component alignment process on a positioning plate that is not in contact with the substrate, the problem of components becoming contaminated by the solder paste (or flux) applied to the substrate may be avoided. Therefore, product yield is improved. In addition, by either shaking or swaying the positioning plate, components with a non-spherical shape can be positioned according to the desired pattern. As a result, the components having a higher mechanical strength than the spherical component can be used in semiconductor fabrication, and different processes which improve the performance of the semiconductor device can be performed. Moreover, by evenly applying a force to the positioning plate, each component is affixed to the substrate. Therefore, the reliability of the semiconductor device is increased.

According to some embodiments, a method for mounting components on a substrate is provided. The method includes providing a positioning plate which has a plurality of through holes. The method further includes supplying components each having a longitudinal portion on the positioning plate. The method also includes performing a component alignment process to put the longitudinal portions of the components in the through holes. In addition, the method includes connecting a substrate to the components which have their longitudinal portions in the through holes and removing the positioning plate.

According to some embodiments, another method for mounting components on a substrate is provided. The method includes providing a positioning plate having a plurality of through holes. The method also includes positioning components in the through holes. The method further includes providing a substrate over the positioning plate as the components are positioned in the through holes. In addition, the method includes applying a force on the positioning plate to affix the component to the substrate. The method further includes removing the positioning plate.

According to some embodiments, an apparatus for mounting components on a substrate is provided. The apparatus includes a component source configured for supplying components. The apparatus also includes positioning plate comprising a number of through holes. The apparatus further includes manipulation drive configured for moving the positioning plate to enable the components to enter the through holes. In addition, the apparatus includes an enforcing element configured for applying a force over the positioning plate as the components are positioned on the positioning so as to connect the components to the substrate.

Although the embodiments and their advantages have been described in detail, it should be understood that various changes, substitutions, and alterations can be made herein without departing from the spirit and scope of the embodiments as defined by the appended claims. Moreover, the scope of the present application is not intended to be limited to the particular embodiments of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:

1. A method, comprising:
   providing a positioning plate which has a plurality of through holes;
   supplying components on the positioning plate;
   performing a component alignment process to put longitudinal portions of the components in the through holes while exposing top portions of the components that connect to the longitudinal portions outside the through holes, wherein the top portions have a width that is wider than that of the longitudinal portion;
   providing a substrate over the positioning plate; and
   connecting the top portions of the components to the substrate with a solder paste material in direct contact with the top portions and the substrate when the longitudinal portions are located in the through holes:
   wherein connecting the substrate to the components comprises:
   placing an enforcing element having a chamber surrounded by a flexible film and a support, wherein the flexible film is in contact with the positioning plate; and
   supplying gas into the chamber to apply a force on the positioning plate toward the substrate.

2. The method as claimed in claim 1, wherein the component alignment process comprises moving the positioning plate multiple times to change the inclined angle of the positioning plate relative to an axis.

3. The method as claimed in claim 1, wherein the component alignment process further comprises shaking the positioning plate as the positioning plate is moved to change the inclined angle.

4. The method as claimed in claim 1, further comprising removing the components that are not in the through holes after the component alignment process is finished by inclining the positioning plate at a predetermined angle.

5. The method as claimed in claim 1, further comprising creating a vacuum underneath the positioning plate via a plurality of pores that are evenly distributed on a bottom support.

6. A method, comprising:
   providing a positioning plate having a plurality of through holes;
   positioning components in the through holes to put longitudinal portions of the components in the through holes while exposing top portions of the components that connect to the longitudinal portions outside the through holes, wherein the top portions have a width that is wider than that of the longitudinal portion;
   providing a substrate over the positioning plate as the components are positioned in the through holes and connecting the top portions of the components to the substrate with a solder paste material in direct contact with the top portions and the substrate; and
   applying a force on the positioning plate toward the substrate to connect the component to the substrate via the solder paste material.

7. The method as claimed in claim 6, wherein the force is applied by rolling a cylindrical roller over the positioning plate.

8. The method as claimed in claim 6, wherein the operation of applying a force on the positioning plate comprises:
   placing an enforcing element having a chamber surrounded by a flexible film and a support, wherein the flexible film is in contact with the positioning plate; and supplying gas into the chamber to apply the force on the positioning plate.

9. The method as claimed in claim 6, wherein the components are positioned in the through holes by performing multiple iterations of a component alignment process in which the positioning plate is moved to change the inclined angle of the positioning plate relative to an axis while simultaneously being shaken.

10. The method as claimed in claim 6, further comprising creating a vacuum underneath the positioning plate via a plurality of pores that are distributed evenly on a bottom support.

11. The method as claimed in claim 1, wherein the component alignment process comprises enabling a round corner of each of the components to be abutted against an edge of the corresponding through hole.

12. The method as claimed in claim 1, further comprising removing the components that are not in the through holes after the component alignment process is finished by use of a brush moving across the positioning plate.

13. The method as claimed in claim 1, further comprising moving the positioning plate with the components to a position located underneath a substrate stage; and
loading the substrate on the substrate stage.

14. The method as claimed in claim 6, wherein during the operation of positioning components in the through holes, a round corner of each of the components is abutted against an edge of the corresponding through hole.

15. The method as claimed in claim 7, further comprising removing the components that are not in the through holes after the component alignment process is finished by use of a brush moving across the positioning plate.

16. The method as claimed in claim 6, further comprising moving the positioning plate with the components to a position located underneath a substrate stage; and
loading the substrate on the substrate stage.

17. The method as claimed in claim 1, wherein surfaces of the top portions of the components that are in direct contact with the solder paste material are connected to contact pads that are located at the same height relative to an upper surface of the positioning plate.

18. The method as claimed in claim 1, wherein surfaces of the top portions of the components that are in direct contact with the solder paste material are connected to an outermost surface of the substrate.

19. A method, comprising:
providing a positioning plate which has a plurality of through holes;
supplying components on the positioning plate;
performing a component alignment process to put longitudinal portions of the components in the through holes while exposing top portions of the components that connect to the longitudinal portions outside the through holes, wherein the top portions have a width that is wider than that of the longitudinal portion;
providing a substrate with an adhesive film formed on an outermost surface of the substrate over the positioning plate; and
connecting the top portions of the components to the substrate with the adhesive film in direct contact with the top portions and the substrate when the longitudinal portions are located in the through holes.

20. The method as claimed in claim 19, further comprising:
heating the substrate by a heater to melt the adhesive film.

* * * * *